US012791435B2

(12) United States Patent
Lu et al.

(10) Patent No.: US 12,791,435 B2
(45) Date of Patent: Nov. 10, 2026

(54) SYSTEMS AND METHODS FOR DETERMINING MECHANICAL WEAR IN A CRYSTAL PULLER

(71) Applicant: GlobalWafers Co., Ltd., Hsinchu (TW)

(72) Inventors: Zheng Lu, O'Fallon, MO (US); William L. Luter, O'Fallon, MO (US); Bashar Ahmed Barghouti, McKinney, TX (US); Wei-Ru Li, Hsinchu City (TW)

(73) Assignee: GlobalWafers Co., Ltd., Hsinchu (TW)

( * ) Notice: Subject to any disclaimer, the term of this patent is extended or adjusted under 35 U.S.C. 154(b) by 727 days.

(21) Appl. No.: 18/184,886

(22) Filed: Mar. 16, 2023

(65) Prior Publication Data

US 2023/0304893 A1 Sep. 28, 2023

Related U.S. Application Data

(60) Provisional application No. 63/269,717, filed on Mar. 22, 2022.

(51) Int. Cl.

| | |
|---|---|
| ***G01M 13/021*** | (2019.01) |
| ***C30B 15/20*** | (2006.01) |
| ***C30B 15/30*** | (2006.01) |
| ***C30B 29/06*** | (2006.01) |

(52) U.S. Cl.
CPC ........... *G01M 13/021* (2013.01); *C30B 15/20* (2013.01); *C30B 15/30* (2013.01); *C30B 29/06* (2013.01)

(58) Field of Classification Search
CPC ......... C30B 15/20; C30B 15/30; C30B 29/06; G01M 13/021
See application file for complete search history.

(56) References Cited

U.S. PATENT DOCUMENTS

| | | | | |
|---|---|---|---|---|
| 5,407,265 | A | | 4/1995 | Hamidieh et al. |
| 5,501,105 | A | | 3/1996 | Hernandez et al. |
| 5,763,838 | A | * | 6/1998 | Morimura ............... C30B 15/28 367/908 |

FOREIGN PATENT DOCUMENTS

| | | | | |
|---|---|---|---|---|
| CN | 111945217 | A | | 11/2020 |
| JP | H06219889 | A | | 8/1994 |
| JP | 2000281484 | A | * | 10/2000 |
| WO | 8808786 | A1 | | 11/1988 |

OTHER PUBLICATIONS

Safizadeh et al., Using multi-sensor data fusion for vibration fault diagnosis of rolling element bearings by accelerometer and load cell, Information Fusion, 18, 1-8, 2014 (Year: 2014).*

(Continued)

*Primary Examiner* — Hua Qi
(74) *Attorney, Agent, or Firm* — Armstrong Teasdale LLP

(57) ABSTRACT

A detection system includes a loadcell connected to a gear and motor of a crystal puller apparatus to measure force applied to the gear in a time domain. The data is analyzed though a Fourier transform to obtain data in the frequency domain. The frequency domain data includes an amplitude which corresponds to mechanical wear of the gear. The time domain data is compared against a threshold amplitude to determine if the gears have mechanical wear such that preventative maintenance can be performed on the motor.

12 Claims, 10 Drawing Sheets

(56) References Cited

OTHER PUBLICATIONS

Safizadeh, M.S. et al., Using Multi-Sensor Data Fusion for Vibration Fault Diagnosis of Rolling Element Bearings by Accelerometer and Load Cell, Information Fusion, vol. 18, Jul. 1, 2014, pp. 1-8.
Ericson, Tristan M. et al., Planetary Gear Modal Vibration Experiments and Correlation Against Lumped-Parameter and Finite Element Models, Journal of Sound and Vibration, vol. 332, No. 9, Jan. 29, 2013, pp. 2350-2375.
Ma, J., Gear Defect Detection Through Model-Based Wideband Demodulation of Vibrations, Mechanical Systems and Signal Processing, vol. 10, No. 5, Sep. 1, 1996, pp. 653-665.
International Search Report and Written Opinion issued by the International Searching Authority in US/PCT2023/064685 dated Jun. 5, 2023, pp. 1-17.
Zuber Ninoslav et al., "Gearbox faults identification using vibration signal analysis and artificial intelligence methods," Eksploatacja i Niezawodnosc—Maintenance and Reliability, 16(1): 61-65 (Jan. 1, 2024) Retrieved from the Internet: URL:https://archive.ein.org.pl/2014-01-10.
European Search Report issued for Application No. 23716998.2 on Jul. 25, 2025 (8 pages).

* cited by examiner

SYSTEMS AND METHODS FOR DETERMINING MECHANICAL WEAR IN A CRYSTAL PULLER

CROSS-REFERENCE TO RELATED APPLICATIONS

This application claims the benefit of U.S. Provisional Patent Application No. 63/269,717, filed on Mar. 22, 2022, which is incorporated herein by reference in its entirety.

FIELD

This disclosure generally relates to the production of single crystal ingots such as silicon ingots, and more specifically, to methods and systems for determining mechanical wear in components of a crystal puller during production and without stopping the crystal puller.

BACKGROUND

Critical moving components in crystal pullers are responsible for steady and controlled rotation and extraction of crystals. Over time and due to heavy load on components of the crystal puller, gears, bearings, pulleys and other components may become severely worn. If not properly monitored and serviced, the components can fail and key functions in crystal pullers can be affected.

Servicing and maintenance of these components is often difficult as the components are inaccessible, and down-time to visually inspect the components is costly and time-consuming. By way of example, a puller head of the crystal puller must be at least partially disassembled and each gear individually inspected for wear. Thus, there is a need to monitor components of a crystal puller and detect problems with those components before wear affects the performance of the crystal puller, quality of the crystal, and before a catastrophic failure occurs, without interrupting crystal growth operation.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect is a crystal pulling system including a crucible containing molten semiconductor material, a cable and gear, a crystal disposed at an end of the cable during pulling of the crystal, and a motor for pulling the cable and crystal from the melt. A loadcell is connected to the gear to measure force applied to the gear and a control system including a processor connected to the loadcell. The processor is configured to process data received from the loadcell and is configured to receive time-domain data from the loadcell over a measurement time during a crystal pull process. The processor also transforms the time-domain data to frequency-domain data in the frequency domain, and the frequency-domain data includes a force-frequency amplitude over the measurement time. The processor determines if the force-frequency amplitude has exceeded a threshold.

Another aspect is a detection system including a loadcell connected to the gear to measure force applied to the gear in a time domain and a control system including a processor connected to the loadcell. The control system is configured to process data received from the loadcell, to receive time-domain data from the loadcell over a measurement time during a crystal pull process, and instruct to transform the time-domain data to frequency-domain data in the frequency domain. The frequency-domain data includes an amplitude over the measurement time, and the processor determines if the amplitude has exceeded a threshold amplitude.

Another aspect is a method for detecting mechanical wear of gears in a crystal puller. The method includes the steps of receiving time-domain data from a loadcell over a measurement time, loadcell connected to the gear to measure force applied to the gear in a time domain; transforming the time-domain data to frequency-domain data in the frequency domain, the frequency-domain data including a amplitude over the measurement time; and determining if the amplitude has exceeded a threshold amplitude.

Various refinements exist of the features noted in relation to the above-mentioned aspect. Further features may also be incorporated in the above-mentioned aspect as well. These refinements and additional features may exist individually or in any combination. For instance, various features discussed below in relation to any of the illustrated embodiments may be incorporated into the above-described aspect, alone or in any combination.

BRIEF DESCRIPTION OF THE DRAWINGS

Like reference symbols in the various drawings indicate like elements.

DETAILED DESCRIPTION

Embodiments of the present disclosure are directed to systems and methods to monitor and analyze selected signals logged by loadcells and through Fourier transform filters in frequency domain such that the characteristic signals associated with failing components can be differentiated reliably from the background noises and other ancillary signals. The analyzed signals are converted from the time domain to the frequency domain and are compared against a threshold or predetermined limit to determine if excessive wear has occurred in gears or components of the crystal puller. The analyzed signals can facilitate detection of periodic error. The periodic error can be due, for example, to vibration, eccentricity or other mechanical irregularities in gears, bearings or shafts of the motor. Embodiments of the present disclosure can monitor conditions in the crystal puller without having to stop production, disassemble the crystal puller or shut the crystal puller down for inspection. Furthermore, upon determination of excessive wear, the crystal puller can be scheduled to undergo maintenance without affecting crystal quality and before a catastrophic failure causing loss of a production crystal.

Figure 1:
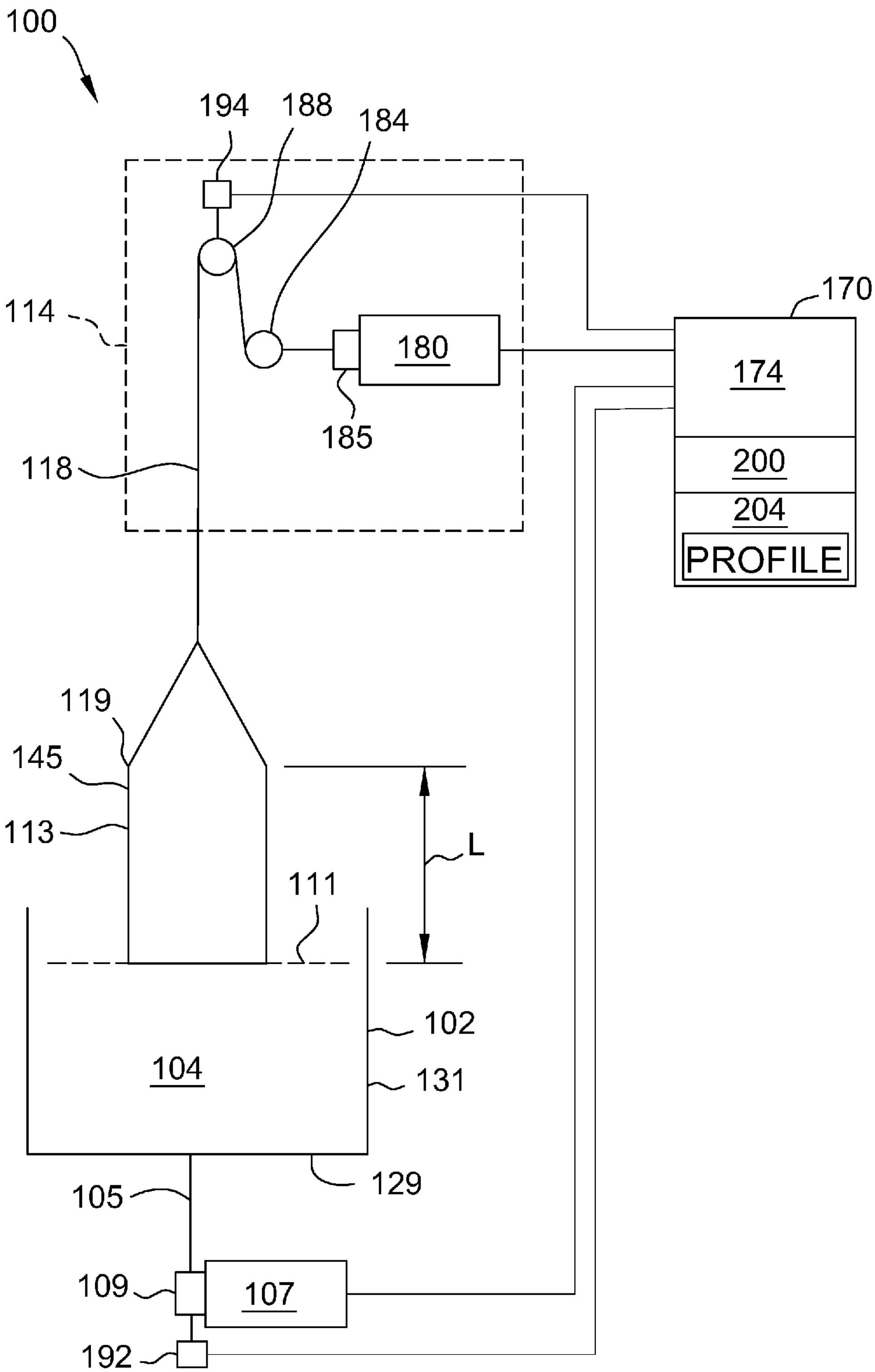
FIG. 1 is a schematic representation of an example ingot puller apparatus used to pull a single crystal silicon ingot from a silicon melt.
Figure 2:
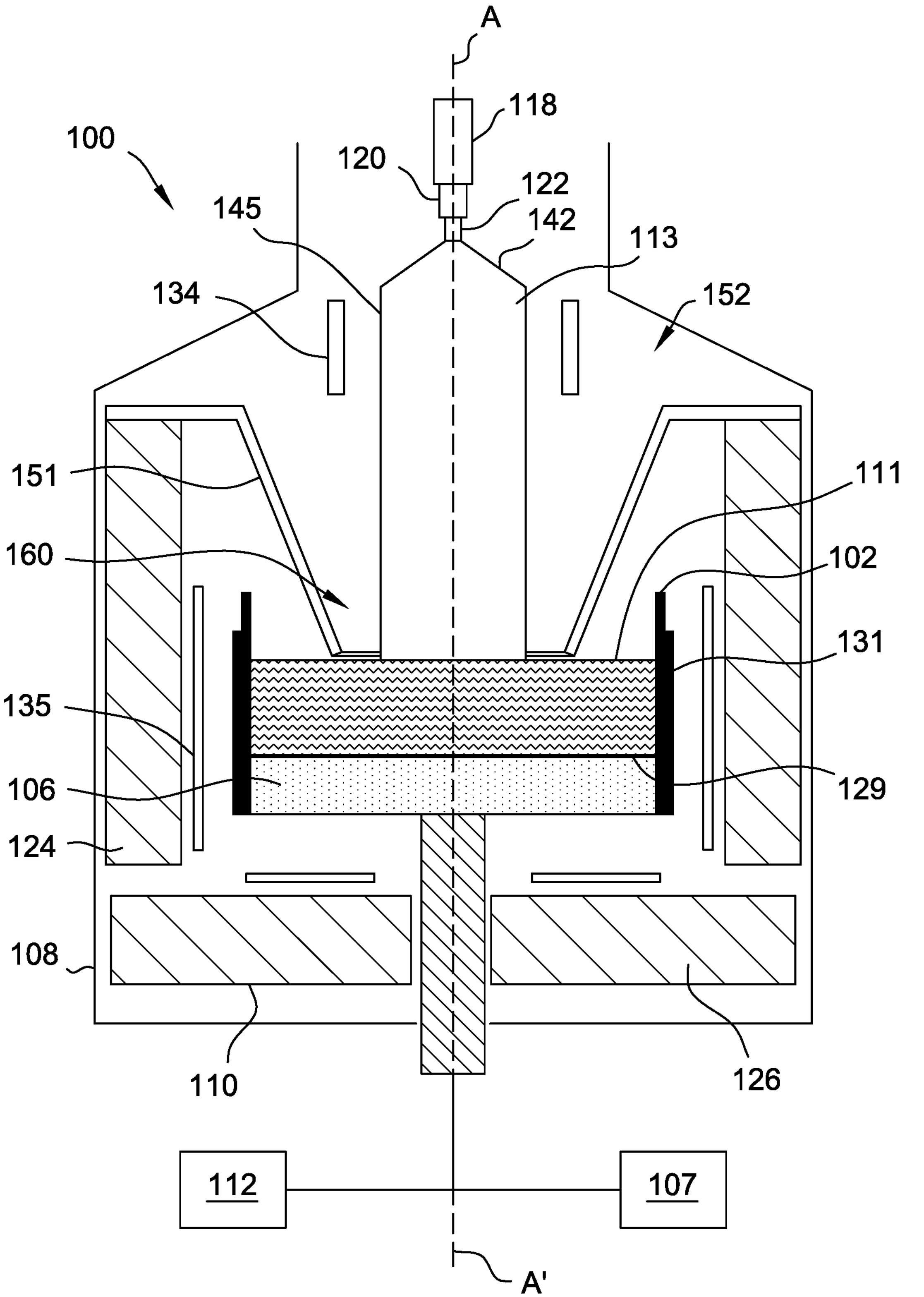
FIG. 2 is a cross-section view of the ingot puller apparatus.
Figure 3:
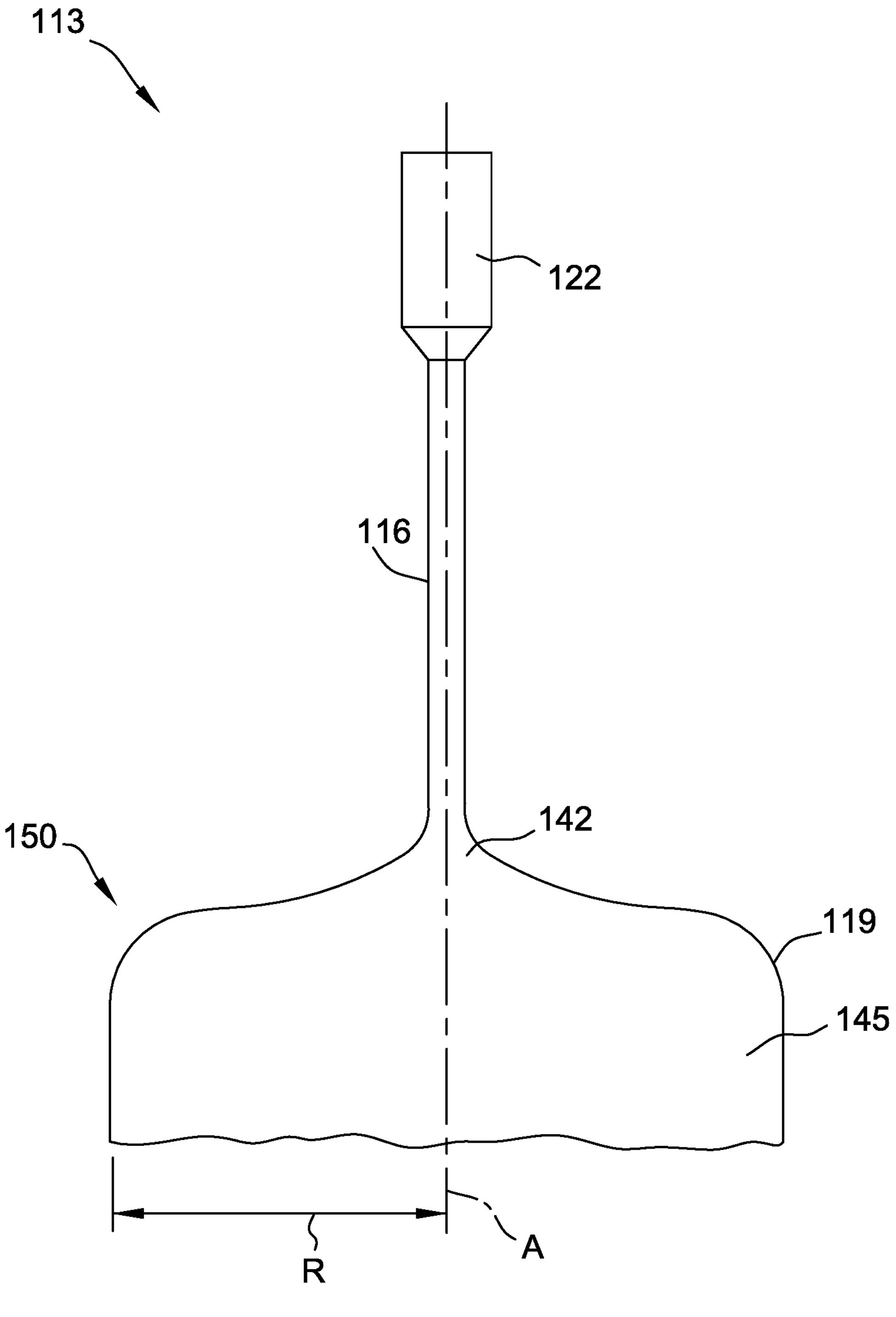
FIG. 3 is a partial view of an example single crystal silicon ingot grown by the Czochralski method.
Figure 4:
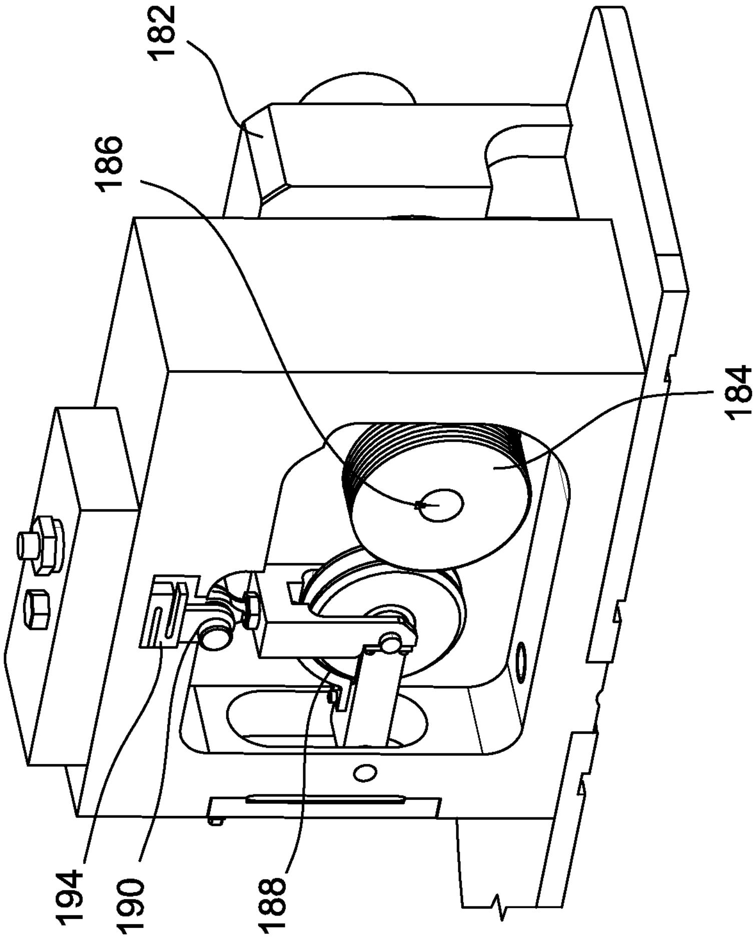
FIG. 4 is a perspective view in partial section of a pulling mechanism.
Figure 5:
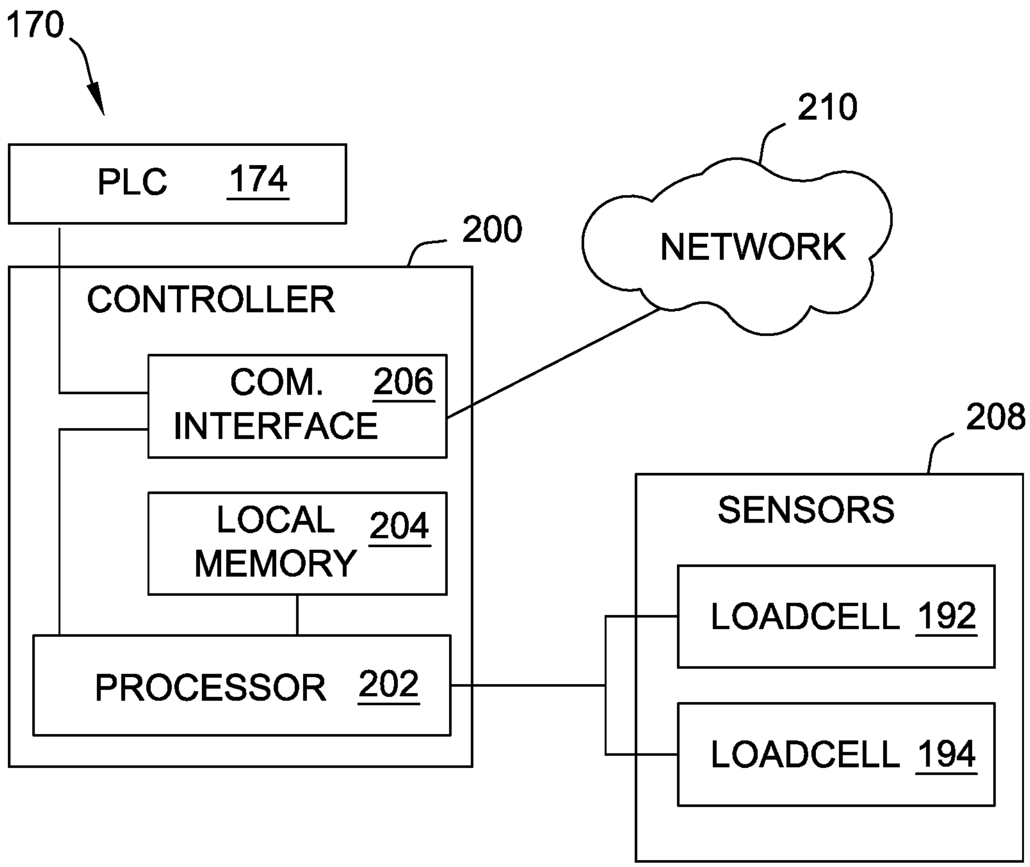
FIG. 5 is a block diagram of a computing device for use in the control system of the ingot puller apparatus of FIG. 1.

An ingot puller apparatus (or more simply "ingot puller" or a "crystal puller") for growing a monocrystalline silicon ingot will be described with reference to FIGS. 1-4. FIGS. 1 and 2 are schematic representations of an ingot puller apparatus indicated generally at "100" to pull a single crystal silicon or semiconductor material ingot from a melt 104. FIG. 3 is a partial front view of a single crystal ingot grown by the Czochralski method, for example in the ingot puller apparatus 100. FIG. 4 is a perspective view of a puller mechanism.

The ingot puller apparatus 100 includes a crystal puller housing 108 that defines a growth chamber 152 for pulling a silicon ingot 113 from a melt 104 of silicon. A control system 170 controls operation of the ingot puller apparatus 100 and its components, including one or more gears. The ingot puller apparatus 100 includes a crucible 102 disposed within the growth chamber 152 for holding the melt 104 of silicon. The crucible 102 is supported by a susceptor 106.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface). The susceptor 106 is supported by a shaft 105. The susceptor 106, crucible 102, shaft 105 and ingot 113 have a common longitudinal axis A or "pull axis" A.

A pulling mechanism 114 is disposed within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley or a drum 117, or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 to be pulled from the melt 104.

During heating and crystal pulling, a crucible drive unit 107 (e.g., a motor) rotates the crucible 102 and susceptor 106. A crucible lift 112 mechanism raises and lowers the crucible 102 along the pull axis A during the growth process. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100.

The crucible drive unit 107 can raise or lower the crucible 102 via a worm gear 109 (one of the components subject to wear). A loadcell 192 is suitably connected to the worm gear 109 or the crucible drive unit 107 to measure force applied to the worm gear 109. The loadcell 192 is suitably a force transducer, but may be another type of sensor. The worm gear 109 is connected in series to a rotor (not shown) of the crucible drive unit 107 by gears or shafts (not shown). The crucible drive unit 107 can include bearings (not shown) which support the shafts. As used herein, the term "gears connected in series" shall refer to a gear train of a mechanical system formed by combinations of gears connected to other gears (i.e. gear teeth of a first gear connected to gear teeth of a second gear) and gears coupled to other gears, e.g., via a rotating shaft. The loadcell 192 is positioned within the motor and is in-situ with the system. Thus, the loadcell 192 can be positioned within the motor enclosure without having to install external components.

As shown in FIGS. 1 and 4, a crystal drive unit 180 (e.g., a motor) may also rotate the pulling cable 118 and ingot 113 in a direction opposite the direction in which the crucible drive unit 107 rotates the crucible 102 (e.g., counter-rotation). In embodiments using iso-rotation, the crystal drive unit may rotate the pulling cable 118 in the same direction in which the crucible drive unit 107 rotates the crucible 102. In addition, the crystal drive unit raises and lowers the ingot 113 relative to the melt surface 111 as desired during the growth process.

The crystal drive unit 180 includes a rotor 182 connected to a cable windup drum 184 by one or more gears 185 and shafts 186. The drum 184, gears 185 and shafts 186 are connected in series. The cable 118 is wound around the drum 184 and subsequently hung from a pulley 188. In some embodiments, the loadcell 194 is a force transducer. In some embodiments, a loadcell 194 is coupled to the pulley 188 by a loadcell linkage or anchor 190 opposite the gear. The gears 185 and shafts 186 of the rotor 182 are supported by bearings (not shown).

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102 (e.g., charge of 250 kg or more). A variety of sources of polycrystalline silicon may be used including, for example, granular polycrystalline silicon produced by thermal decomposition of silane or a halosilane in a fluidized bed reactor or polycrystalline silicon produced in a Siemens reactor. Once polycrystalline silicon is added to the crucible to form a charge, the charge is heated to a temperature above about the melting temperature of silicon (e.g., about 1412° C.) to melt the charge. In some embodiments, the charge (i.e., the resulting melt) is heated to a temperature of at least about 1425° C., at least about 1450° C. or even at least about 1500° C. The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104. The ingot 113 includes a crown portion 142 in which the ingot transitions and tapers outward from the seed crystal 122 to reach a target diameter. The ingot 113 includes a constant diameter portion or cylindrical main body 145 of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104. The ingot 113 has a central longitudinal axis A that extends through the crown portion 142 and a terminal end of the ingot 113.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system 170 so that the temperature of the melt 104 is controlled throughout the pulling process.

The ingot puller apparatus 100 also includes a reflector 151 (or "heat shield") disposed within the growth chamber 152 and above the melt 104 which shrouds the ingot 113 during ingot growth. The reflector 151 may be partially disposed within the crucible 102 during crystal growth. The reflector 151 defines a central passage 160 for receiving the ingot 113 as the ingot is pulled by the pulling mechanism 114.

The reflector 151 is, in general, a heat shield adapted to retain heat underneath itself and above the melt 104. In this regard, any reflector design and material of construction (e.g., graphite or gray quartz) known in the art may be used without limitation.

A single crystal silicon ingot 113 produced in accordance with embodiments of the present disclosure and, generally, the Czochralski method is shown in FIG. 3. The ingot 113 includes a neck 116, an outwardly flaring portion 142 (synonymously "crown" or "cone"), a shoulder 119 and a constant diameter main body 145. The neck 116 is attached to the seed crystal 122 that was contacted with the melt and withdrawn to form the ingot 113. The main body 145 is suspended from the neck 116. The neck 116 terminates once the outwardly flaring portion 142 of the ingot 113 begins to form.

The constant diameter portion of the ingot 113 has a circumferential edge 150, a central axis A that is parallel to the circumferential edge 150 and a radius R that extends from the central axis A to the circumferential edge. The central axis A also passes through the outwardly flaring portion 142 and neck 116. The diameter of the main body 145 may vary and, in some embodiments, the diameter may be about 150 mm, about 200 mm, about 300 mm, greater than about 300 mm, about 450 mm or even greater than about 450 mm.

The single crystal silicon ingot 113 may generally have any resistivity. The single crystal silicon ingot 113 may be doped or undoped.

The loadcell 192 of the crucible drive unit 107 and the loadcell 194 crystal drive unit 180 are part of a measurement system that is used to measure loads of the crucible drive unit 107 and the crystal drive unit 180. Stated differently, the loadcell 192 of the crucible drive unit 107 measures the weight of the crystal supported by the shaft 105 and the loadcell 194 of the crystal drive unit 180 measures the weight of the crystal supported by the pulling cable 118 of the crystal drive unit 180.

Rotation of gears and shafts of the crucible drive unit 107 and the crystal drive unit 180 produce vibrations which can be detected and measured by the loadcells (192, 194) in the time domain. Data transmitted from the loadcells (192, 194) can be collected by a control system 170, processed by a computing device 200 and transformed through an algorithm to obtain data in the frequency domain as explained in further detail below to determine if wear on gears and bearings, or more generally components of the motors of the crucible drive unit 107 and the crystal drive unit 180.

Figure 6:
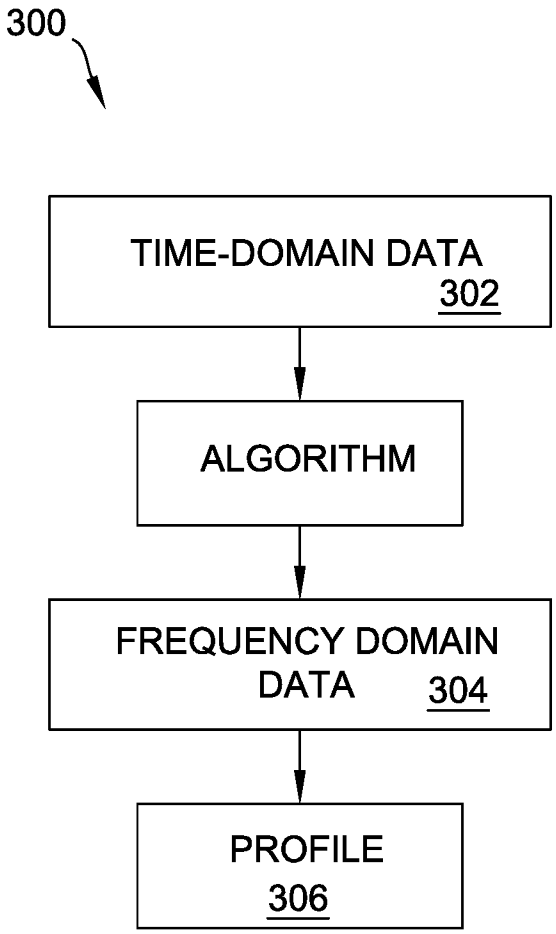
FIG. 6 is a flowchart showing conversion of time-domain data to frequency domain data.

FIG. 6 is an example computing device 200 that may be used as or as part of the control system 170. The computing device 200 also functions as a detection system. The computing device 200 includes a processor 202, a local memory 204, a communications interface 206 and a plurality of sensors 208. The plurality of sensors 208 include loadcells (192, 194) which are connected to the processor 202. Other embodiments include different components, additional components, and/or do not include all components shown in FIG. 6.

The communications interface 206 and the computing device 200 are connected to a programmable logic controller or "PLC" 174. The PLC 174 controls the operation of at least the motors of the crucible drive unit 107 and the crystal drive unit 180, and the heaters (126,135).

The processor 202 is configured for executing instructions. For example, executable instructions are stored in the memory 204 and the processor 202 may include one or more processing units (e.g., in a multi-core configuration). The one or more processing units suitably perform individual functions of the processor 202 and execute all of part of the instructions. The term processor, as used herein, refers to central processing units, microprocessors, microcontrollers, reduced instruction set circuits (RISC), application specific integrated circuits (ASIC), a programmable logic circuit (PLC), and any other circuit or processor capable of executing the functions described herein. The above are examples only, and are thus not intended to limit in any way the definition and/or meaning of the term "processor."

The local memory 204 stores non-transitory, computer-readable instructions for performance of the techniques described herein. Such instructions, when executed by the processor 202, cause the processor 202 to perform at least a portion of the methods described herein. In some embodiments, the memory 204 stores computer-readable instructions for providing a user interface to the user via a media output component and, receiving and processing input from an input device. The memory 204 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Although illustrated as separate from the processor 202, in some embodiments the memory 204 is combined with the processor 202, such as in a microcontroller or microprocessor, but may still be referred to separately. The above memory types are examples only, and are thus not limiting as to the types of memory usable for storage of a computer program.

In some embodiments, the computing device 200 includes, or is connected to, an input device for receiving input from the user. The input device is any device that permits the computing device 200 to receive analog and/or digital commands, instructions, or other inputs from the user, including visual, audio, touch, button presses, stylus taps, etc. The input device may include, for example, a variable resistor, an input dial, a keyboard/keypad, a pointing device, a mouse, a stylus, a touch sensitive panel (e.g., a touch pad or a touch screen), a gyroscope, an accelerometer, a position detector, an audio input device, or any combination thereof. A single component such as a touch screen may function as both an output device of the media output component and the input device.

The communication interface enables the computing device 200 to communicate with remote devices and systems forming a network 210, such as remote sensors, remote databases, remote computing devices, and the like, and may include more than one communication interface for interacting with more than one remote device or system. The communication interfaces may be wired or wireless communications interfaces that permit the computing device 200 to communicate with the remote devices and systems directly or via a network. Wireless communication interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Washington; ZigBee is a registered trademark of the ZigBee Alliance of San Ramon, California.) Wired communication interfaces may use any suitable wired communication protocol for direct communication including, without limitation, USB, RS232, I2C, SPI, analog, and proprietary I/O protocols. In some embodiments, the wired communication interfaces include a wired network adapter allowing the computing device 400 to be coupled to a network, such as the Internet, a local area network (LAN), a wide area network (WAN), a mesh network, and/or any other network to communicate with remote devices and systems via the network 210

FIG. 6 illustrates a flowchart 300 for receiving data from the loadcells (192, 194) and processing the data through an algorithm to obtain output data which is then compared against a profile stored in memory 204 to determine if mechanical wear or failure has occurred on components of the crucible drive unit 107 and the crystal drive unit 180. The loadcells (192, 194) transmit time-domain data 302 to the processor 202. In some embodiments, the processor 202 can execute instructions to process the time-domain data 302 through an algorithm to convert the time-domain data 302 to frequency-domain data 304. In some embodiments, the processor 202 can execute instructions to send the time-domain data 302 to the network 210 such that one or more processors of the network 210 can execute instructions to process the time-domain data 302 through an algorithm to convert the time-domain data 302 to frequency-domain data 304. The frequency-domain data 304 is then compared against a profile 306 stored in memory 204 to determine if mechanical wear or failure has occurred on components of the crucible drive unit 107 and the crystal drive unit 180. The profile 306 includes one or more threshold values which the frequency-domain data 304 is compared against. If the frequency-domain data 304 is greater than the one or more threshold values, it is determined that mechanical wear or failure has occurred on components of the crucible drive unit 107 and the crystal drive unit 180. As used herein, the term "threshold" and "threshold values" refers to guard band limits in the frequency-domain.

Figure 7:
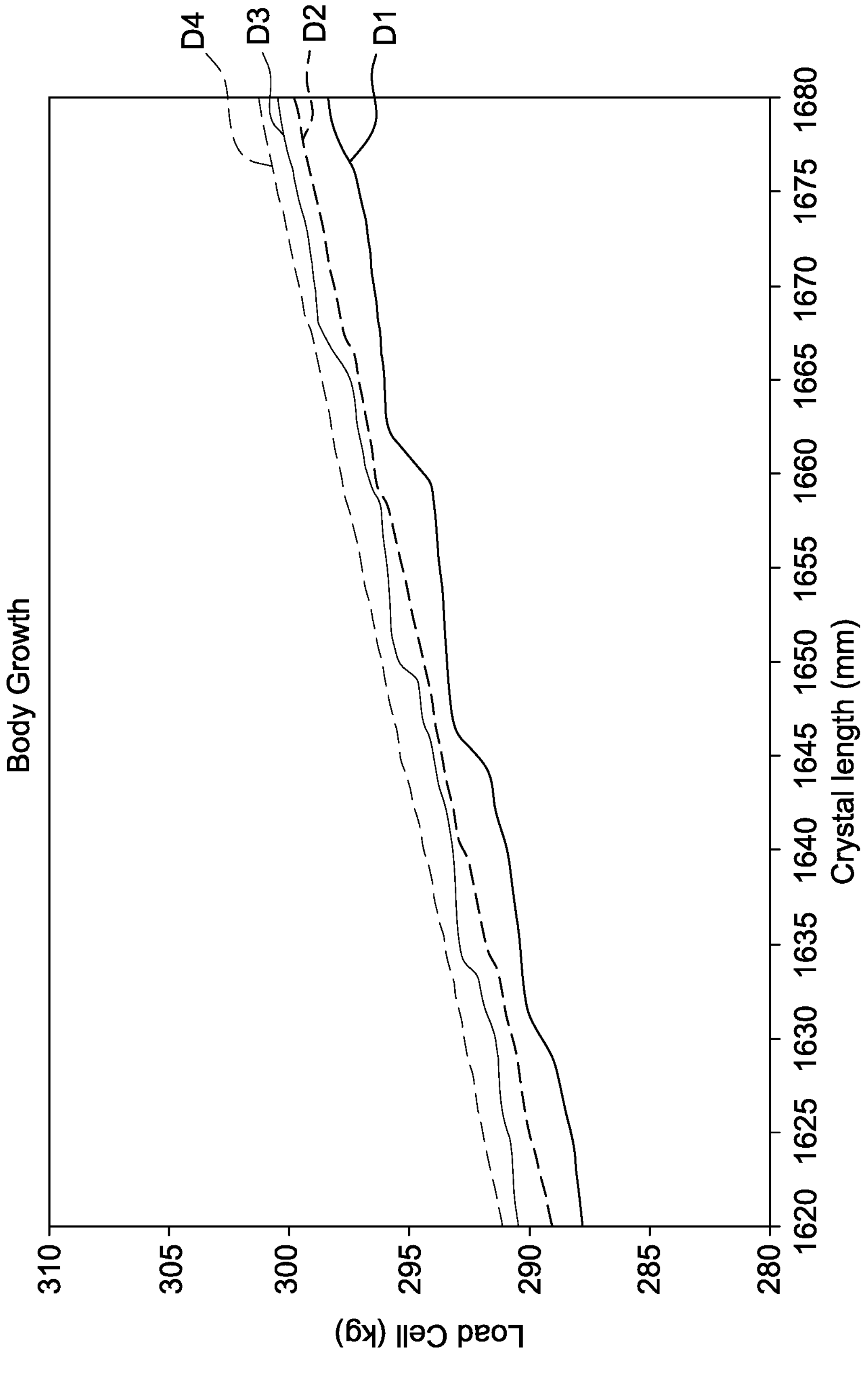
FIG. 7 is a chart of load cell data in the time domain of a motor having components with mechanical wear.
Figure 8:
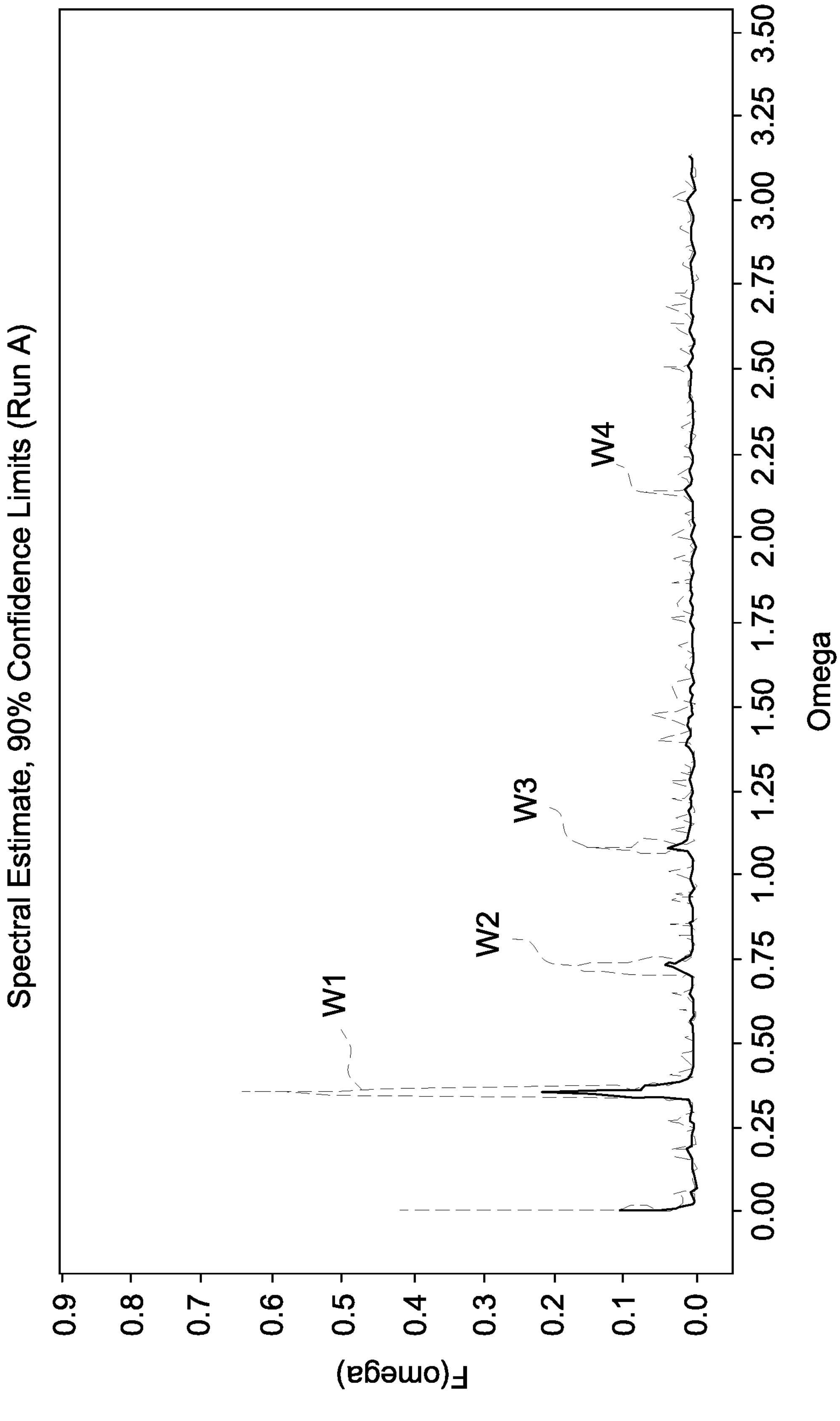
FIG. 8 is a chart of load cell data in the frequency domain of a motor having components with mechanical wear.

In some embodiments, the algorithm is a Fourier transform. In some embodiments, the algorithm is a Fast Fourier transform. In some embodiments, the algorithm is a Discrete Fourier transform. As used herein, the term "time-domain data" refers to mathematical functions, physical signals or time series of data with respect to time. Time-domain graphs (as shown in FIG. 7) measures data gathered over a period of time. As used herein, the term "frequency-domain data" refers to mathematical functions and signals with respect to frequency, rather than time. Where a time-domain graph illustrates signal or data changes over time, a frequency-domain graph (as shown in FIG. 8) illustrates the amplitude of the data or signal within a given frequency band over a range of frequencies.

FIG. 7 illustrates loadcell data in the time-domain over a particular range of crystal growth length L. As shown in FIG. 1, the crystal length L is the length of the constant diameter portion or cylindrical main body 145. Stated differently, the crystal length L is from the melt surface 111. The loadcell data in the time-domain is gathered over a period of time T (or more generally a measurement time) where the ingot 113 has a crystal length L of 1500 mm to 1700 mm, defining an operating condition of the control system 170 for determining mechanical wear. In some embodiments, the operating condition (and the period of time T) includes a crystal length L of 100% of the total crystal length. In some embodiments, the operating condition (and the period of time T) includes a crystal length L of 80% of the total crystal length. In some embodiments, the operating condition (and the period of time T) includes a crystal length L of 60% of the total crystal length. In some embodiments, the operating condition (and the period of time T) includes a crystal length L of 40% of the total crystal length. In some embodiments, the operating condition (and the period of time T) includes a crystal length L of 20% of the total crystal length.

In some embodiments, the processor 202 is configured to identify the operating condition for the processor 202 to receive time-domain data from the loadcell. In some embodiments, the processor is configured to receive time-domain data over the entire crystal pull process.

As illustrated in FIG. 7, over the components such as bearings, gears and worm gears of the crucible drive unit 107 and the crystal drive unit 180 exhibit fluctuations of weight (in kg) or more generally, fluctuations in force data gathered by the loadcells (192, 194) as illustrated by data (D1, D2, D3, D4) over the operating condition and thus over the period of time T. Data D1 and Data D3 illustrate fluctuations in weight of mechanically worn components of the crucible drive unit 107 and the crystal drive unit 180, Data D2 illustrate fluctuations in weight of serviced components of the crucible drive unit 107 and the crystal drive unit 180 and Data D4 illustrates fluctuations in weight of new and unworn components of the crucible drive unit 107 and the crystal drive unit 180. Fluctuations in weight due to wear also cause vibrations which are detected by the loadcells (192, 194) over the operating condition. Vibrations and fluctuations in weight are progressively greater as the ingot 113 grows in length.

Fluctuations in weight due to mechanical wear are difficult to detect in the time domain until the mechanical wear has progressed to near failure. This is due to a lack of resolution and ancillary vibrations and noise present in the system.

Figure 9:
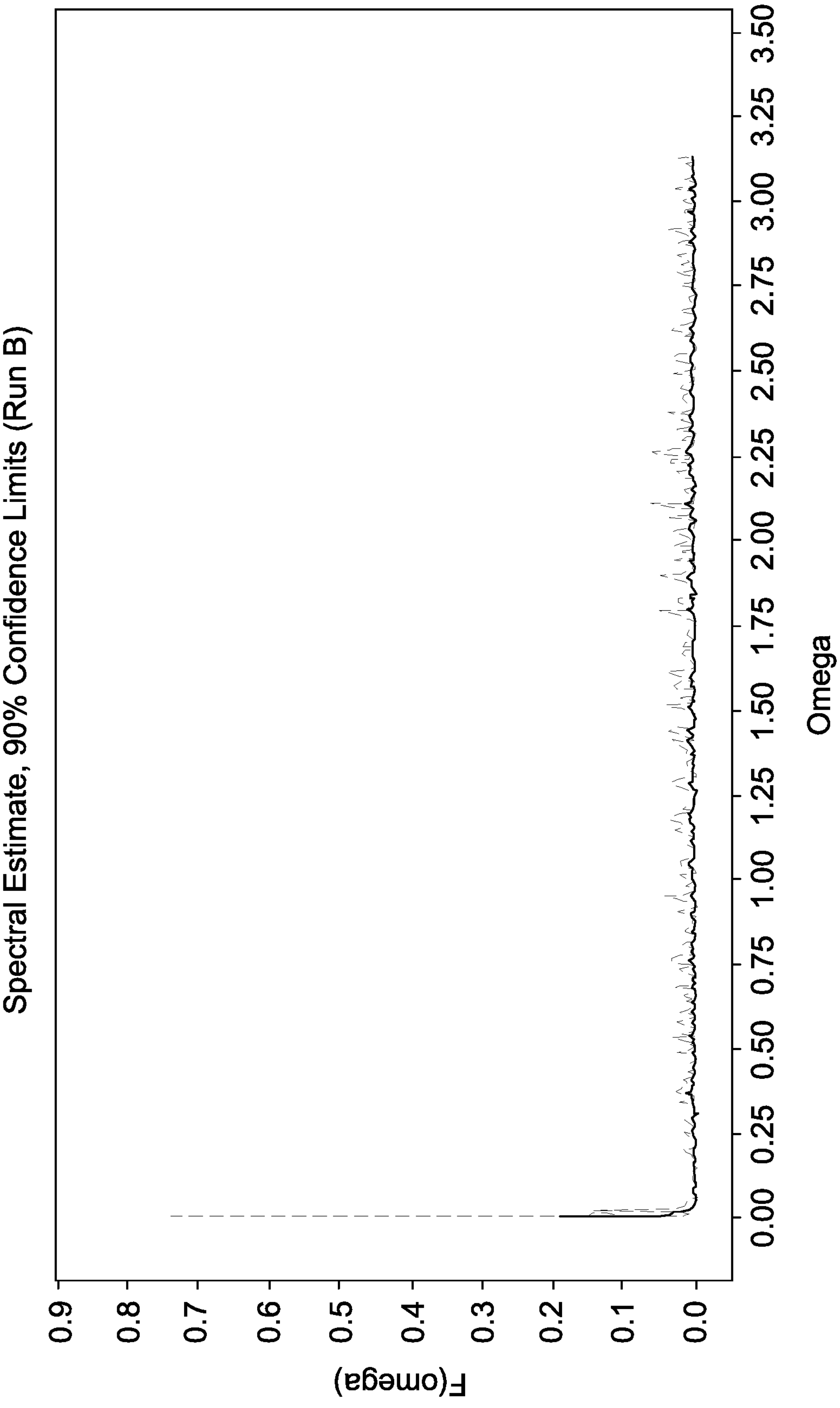
FIG. 9 is a chart of load cell data in the frequency domain of a motor having components without mechanical wear.
Figure 10:
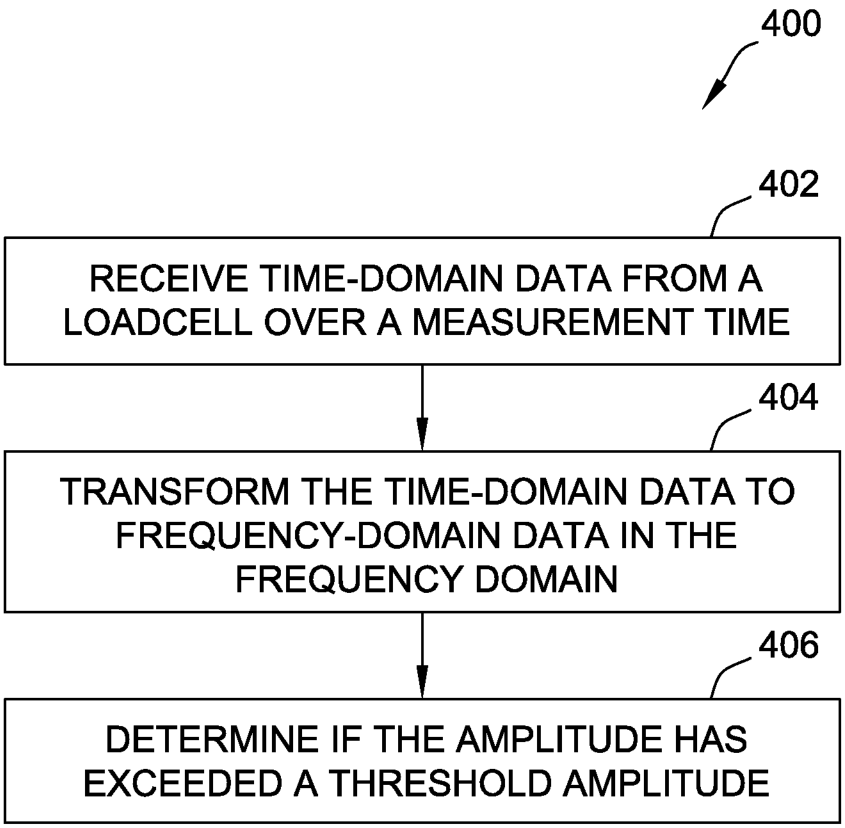
FIG. 10 is a method for determining wear in components of a gear.

As shown in FIGS. 8 and 9, analyzing the loadcell data in the time domain through Fourier transform filters in frequency domain produces frequency amplitudes or peaks ω which correspond to the variations due to wear. FIG. 8 illustrates amplitudes ω1, ω2, ω3, and ω4, which correspond to weight fluctuations of components due to mechanical wear. Each amplitude (ω1, ω2, ω3, ω4) has a F(ω4) frequency which corresponds to the degree of wear. Furthermore, the loadcells (190, 192) can detect vibrations of for components connected in series, which correspond to increasing frequencies (as denoted by the X-axis). Thus, a single loadcell can produce, with Fourier transform filters, a plurality of force-frequency amplitudes (ω1, ω2, ω3, ω4) for all components connected in series. Each amplitudes ω1, ω2, ω3, and ω4 are included in the frequency-domain data 304 and are compared against the threshold values stored in the memory 204.

As shown in FIG. 9, new components, or more generally components which do not exhibit mechanical wear, do not have detectable amplitudes in the frequency-domain data 304. Thus, by gathering time-domain data 302 from the loadcells (192, 194) and processing the time-domain data 302 through the algorithm yields frequency-domain data 304 which can be compared and analyzed to determine if wear has occurred on the components.

A method 402 for detecting mechanical wear of gears, or more generally components of the crucible drive unit 107 and the crystal drive unit 180 comprises the steps of: receiving 402 time-domain data 302 from the loadcells (190, 192)) over a measurement time, transforming 404 the time-domain data 302 to frequency-domain data 304 in the frequency domain and, determining 406 if the amplitude has exceeded a threshold amplitude. If mechanical wear is determined to have occurred, preventative maintenance can be performed on the components before mechanical failure occurs.

The computer systems discussed herein may include additional, less, or alternate functionality, including that discussed elsewhere herein. The computer systems discussed herein may include or be implemented via computer-executable instructions stored on non-transitory computer-readable media or medium.

Any logic flows depicted in the figures do not require the particular order shown, or sequential order, unless specified. In addition, other steps may be provided, or steps may be eliminated, from the described flows, and other components may be added to, or removed from, the described systems. The above embodiments that have been described in detail are merely example or possible embodiments, and that there are other combinations, additions, or alternatives within the scope of this disclosure. Also, the particular naming of the components, capitalization of terms, the attributes, data structures, or any other programming or structural aspect is not mandatory or significant, and the mechanisms that implement the disclosure or its features may have different names, formats, or protocols. Further, the system may be implemented via a combination of hardware and software, as described, or entirely in hardware elements. Also, the division of functionality between the various system components described herein is merely one example, and not mandatory; functions performed by a single system component may instead be performed by multiple components, and functions performed by multiple components may instead performed by a single component.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A crystal pulling system comprising:

a crucible containing molten semiconductor material;

a cable and a gear;

a crystal disposed at an end of the cable, a motor for pulling the cable and the crystal from a melt of molten semiconductor material in the crucible;

a loadcell connected to the gear to measure force applied to the gear; and, a control system including a processor connected to the loadcell, the processor configured to process data received from the loadcell, the processor configured to:

receive time-domain data from the loadcell over a measurement time during a crystal pull process, transform the time-domain data to frequency-domain data in the frequency domain, the frequency-domain data including a force-frequency amplitude over the measurement time; and, determine if the force-frequency amplitude has exceeded a threshold.

2. The system of claim 1, wherein the loadcell reads a predetermined number of data samples over the measurement time.

3. The system of claim 1, wherein the processor is configured to identify an operating condition for the processor to receive time-domain data from the loadcell.

4. The system of claim 3, wherein the operating condition includes the crystal pulled to one of 100% of a total crystal length, 80% of the total crystal length, 60% of the total crystal length, and 20% of the total crystal length.

5. The system of claim 1, wherein the processor applies an algorithm to transform the time-domain data to frequency-domain data.

6. The system of claim 1, wherein the processor applies one of a Fourier Transform, a Fast Fourier Transform and a Discrete Fourier Transform to transform the time-domain data to frequency-domain data.

7. The system of claim 1, wherein the loadcell measures at least one of force on the gear and vibration of the gear.

8. The system of claim 1, wherein the loadcell is in-situ with the gear and the motor.

9. The system of claim 8, wherein the loadcell is hung from the gear by an anchor.

10. The system of claim 9, wherein the gear is one of a plurality of gears connected to the motor in series, wherein the loadcell measures vibration of the gears connected to the motor in series.

11. The system of claim 10, wherein the frequency-domain data includes a plurality of force-frequency amplitudes; and, wherein the processor is configured to determine if the force-frequency amplitude has exceeded a threshold by determining if one or more of the plurality of force-frequency amplitudes has exceeded the threshold.

12. The system of claim 11, wherein each of the plurality of amplitudes correspond to vibrations of the gears.

* * * * *